US012628284B2

(12) United States Patent
Lombardi et al.

(10) Patent No.: US 12,628,284 B2
(45) Date of Patent: May 12, 2026

(54) INTERNAL HARDWARE CONFIGURATIONS WITHIN FOLDABLE ELECTRONIC DEVICES

(71) Applicant: Google LLC, Mountain View, CA (US)

(72) Inventors: Michael J. Lombardi, South Barrington, IL (US); Joseph Allore, Mundelein, IL (US); Avi Pinchas Hecht, San Francisco, CA (US); Yongho Lim, Kildeer, IL (US); Michael E. Bentz, II, Prairie View, IL (US)

(73) Assignee: Google LLC, Mountain View, CA (US)

( * ) Notice: Subject to any disclaimer, the term of this patent is extended or adjusted under 35 U.S.C. 154(b) by 184 days.

(21) Appl. No.: 18/671,124

(22) Filed: May 22, 2024

(65) Prior Publication Data

US 2024/0314946 A1     Sep. 19, 2024

Related U.S. Application Data

(60) Provisional application No. 63/648,528, filed on May 16, 2024.

(51) Int. Cl.
| | |
|---|---|
| *H05K 5/00* | (2025.01) |
| *G06F 1/16* | (2006.01) |
| *H05K 5/02* | (2006.01) |

(52) U.S. Cl.
CPC ......... H05K 5/0086 (2013.01); G06F 1/1616 (2013.01); G06F 1/1635 (2013.01); (Continued)

(58) Field of Classification Search
CPC ...... H05K 5/0086; H05K 5/02; G06F 1/1616; G06F 1/1635; G06F 1/1652; G06F 1/1658
See application file for complete search history.

(56) References Cited

U.S. PATENT DOCUMENTS 6,524,732 B1 *   2/2003   Iwaizono .............. H01M 10/42
                                                          429/96
8,610,822 B2   12/2013   Weber et al.
                  (Continued)

FOREIGN PATENT DOCUMENTS

| CN | 111241890 | 6/2020 |
|---|---|---|
| CN | 111477135 | 7/2020 |

(Continued)

OTHER PUBLICATIONS

"International Preliminary Report on Patentability", Application No. PCT/US2020/047670, Feb. 28, 2023, 10 pages.

(Continued)

*Primary Examiner* — Allen L Parker
*Assistant Examiner* — Martin Antonio Asmat Uceda
(74) *Attorney, Agent, or Firm* — Colby Nipper PLLC

(57)     ABSTRACT

This document describes systems and techniques directed at internal hardware configurations for foldable devices. In aspects, a foldable electronic device includes a housing, defining an internal cavity within which a battery is disposed, and one or more displays that are fixed to the housing, forming at least one internal cavity. The foldable electronic device further includes one or more battery cell tabs that are arranged in an unfolded configuration and extend from the battery to a power control module positioned underneath a display control module that is mounted to the display. Through such a configuration, an internal volume within the internal cavity can be more-efficiently occupied by increasing a battery capacity or reducing a dimensional profile of the foldable electronic device.

7 Claims, 7 Drawing Sheets

New Configuration
Section View A-A

New Configuration
Section View 2-2

(52) U.S. Cl.
　CPC .......... *G06F 1/1652* (2013.01); *G06F 1/1658*
　　　　(2013.01); *H05K 5/02* (2013.01)

(56)　　　　　References Cited

U.S. PATENT DOCUMENTS

| | | | |
|---|---|---|---|
| 9,497,697 | B2 * | 11/2016 | Becze ................ H04N 21/4316 |
| 9,570,019 | B2 | 2/2017 | Musgrave et al. |
| 10,019,121 | B2 | 7/2018 | Choi et al. |
| 10,021,226 | B2 | 7/2018 | Gagne-keats et al. |
| 10,068,551 | B1 | 9/2018 | Choi et al. |
| 10,120,428 | B2 * | 11/2018 | Kim ......................... G06F 1/28 |
| 10,440,839 | B2 | 10/2019 | Cheng |
| 10,477,708 | B2 * | 11/2019 | Lee ...................... H05K 5/0069 |
| 10,522,839 | B2 * | 12/2019 | Lee ...................... G06F 1/1626 |
| 10,530,167 | B2 * | 1/2020 | Yi ....................... H02J 7/00719 |
| 10,542,632 | B2 * | 1/2020 | Kim ......................... H05K 1/14 |
| 10,559,786 | B2 * | 2/2020 | Marasco ............ H01M 10/425 |
| 10,742,788 | B2 | 8/2020 | Shin et al. |
| 10,777,621 | B2 | 9/2020 | Lee et al. |
| 10,838,452 | B2 | 11/2020 | Siddiqui et al. |
| 10,890,954 | B2 | 1/2021 | Evans et al. |
| 10,985,358 | B2 * | 4/2021 | Wang ................. H01M 50/533 |
| 10,985,417 | B2 * | 4/2021 | Kim ................. H01M 10/6554 |
| 11,163,970 | B1 | 11/2021 | Sammoura et al. |
| 11,412,120 | B2 | 8/2022 | Manea et al. |
| 11,552,339 | B2 * | 1/2023 | Balaram ........... H01M 10/4257 |
| 11,782,483 | B2 | 10/2023 | Lonbardi et al. |
| 11,824,151 | B2 * | 11/2023 | Kwak ................. H01M 50/178 |
| 12,029,071 | B2 | 7/2024 | Tao et al. |
| 12,381,966 | B2 * | 8/2025 | Luo ..................... H04M 1/0268 |
| 2002/0050958 | A1 | 5/2002 | Matthies et al. |
| 2006/0093928 | A1 | 5/2006 | Hung et al. |
| 2006/0124209 | A1 | 6/2006 | Schroers et al. |
| 2007/0070272 | A1 | 3/2007 | Gettemy et al. |
| 2008/0123032 | A1 | 5/2008 | Taniguchi et al. |
| 2010/0053853 | A1 | 3/2010 | Allore et al. |
| 2010/0207860 | A1 | 8/2010 | Chang et al. |
| 2011/0175852 | A1 | 7/2011 | Goertz et al. |
| 2011/0255000 | A1 | 10/2011 | Weber et al. |
| 2012/0120098 | A9 | 5/2012 | Faulkner et al. |
| 2013/0088671 | A1 | 4/2013 | Drzaic et al. |
| 2013/0342519 | A1 | 12/2013 | Kim et al. |
| 2014/0016076 | A1 | 1/2014 | Braganza et al. |
| 2014/0118985 | A1 | 5/2014 | Hassember |
| 2014/0147703 | A1 * | 5/2014 | Werner ............... H01M 50/553 |
| | | | 429/7 |
| 2014/0218321 | A1 | 8/2014 | Lee et al. |
| 2014/0240911 | A1 | 8/2014 | Cole et al. |
| 2014/0265822 | A1 | 9/2014 | Drzaic et al. |
| 2014/0292628 | A1 | 10/2014 | Park |
| 2015/0070826 | A1 | 3/2015 | Montevirgen et al. |
| 2015/0138434 | A1 | 5/2015 | Chuang et al. |
| 2015/0301417 | A1 | 10/2015 | Park et al. |
| 2015/0331292 | A1 | 11/2015 | Yang et al. |
| 2016/0063933 | A1 | 3/2016 | Kobayashi et al. |
| 2016/0078838 | A1 | 3/2016 | Huang et al. |
| 2016/0210923 | A1 | 7/2016 | Yoshida et al. |
| 2016/0218151 | A1 | 7/2016 | Kwon et al. |
| 2016/0227654 | A1 | 8/2016 | Kim et al. |
| 2016/0234361 | A1 | 8/2016 | Baek et al. |
| 2016/0268649 | A1 * | 9/2016 | Heo ................... H01M 50/202 |
| 2016/0276647 | A1 * | 9/2016 | Lee .................... H01M 50/202 |
| 2016/0282987 | A1 | 9/2016 | Choi et al. |
| 2016/0337570 | A1 | 11/2016 | Tan et al. |
| 2017/0004760 | A1 | 1/2017 | Jang et al. |
| 2017/0062547 | A1 | 3/2017 | Mathew et al. |
| 2017/0092196 | A1 | 3/2017 | Gupta et al. |
| 2017/0116932 | A1 | 4/2017 | Musgrave et al. |
| 2017/0168463 | A1 | 6/2017 | Hong et al. |
| 2017/0250554 | A1 * | 8/2017 | Tajima ............... A44C 5/0053 |
| 2017/0287992 | A1 | 10/2017 | Kwak et al. |
| 2017/0322357 | A1 | 11/2017 | De Jong et al. |
| 2017/0374749 | A1 | 12/2017 | Lee et al. |
| 2018/0095502 | A1 | 4/2018 | Yamazaki et al. |
| 2018/0260602 | A1 | 9/2018 | He et al. |

| | | | |
|---|---|---|---|
| 2018/0277051 | A1 | 9/2018 | Du |
| 2019/0123112 | A1 | 4/2019 | Lee et al. |
| 2019/0180691 | A1 | 6/2019 | Takasugi |
| 2019/0228740 | A1 | 7/2019 | Aflatooni et al. |
| 2019/0303639 | A1 | 10/2019 | He et al. |
| 2020/0084310 | A1 | 3/2020 | Keen et al. |
| 2020/0117933 | A1 | 4/2020 | Chang et al. |
| 2020/0273427 | A1 | 8/2020 | Wang |
| 2020/0273919 | A1 | 8/2020 | Ding et al. |
| 2021/0020698 | A1 | 1/2021 | Xianyu et al. |
| 2021/0020893 | A1 * | 1/2021 | Jeon ................... H01M 50/557 |
| 2021/0192984 | A1 | 6/2021 | Yoo et al. |
| 2021/0201731 | A1 | 7/2021 | Ranjan et al. |
| 2021/0286407 | A1 | 9/2021 | Kim et al. |
| 2021/0296717 | A1 | 9/2021 | Lombardi et al. |
| 2021/0297563 | A1 | 9/2021 | Manea et al. |
| 2021/0408140 | A1 | 12/2021 | Han et al. |
| 2022/0043488 | A1 | 2/2022 | Lombardi et al. |
| 2022/0050506 | A1 | 2/2022 | Gehlen et al. |
| 2022/0058254 | A1 | 2/2022 | Park et al. |
| 2022/0103672 | A1 | 3/2022 | Jung et al. |
| 2023/0161390 | A1 | 5/2023 | Silvanto et al. |
| 2023/0253634 | A1 | 8/2023 | Ardisana et al. |
| 2023/0393618 | A1 | 12/2023 | Park et al. |
| 2024/0129401 | A1 | 4/2024 | Park et al. |
| 2024/0179859 | A1 | 5/2024 | Liu et al. |
| 2024/0248512 | A1 | 7/2024 | Tang et al. |
| 2024/0274898 | A1 * | 8/2024 | Park ................... H01M 50/574 |
| 2025/0007123 | A1 * | 1/2025 | Park ................... H01M 10/425 |
| 2025/0175015 | A1 * | 5/2025 | Shi ........................... G06F 1/263 |
| 2025/0182240 | A1 * | 6/2025 | Liu ......................... G06F 3/147 |

FOREIGN PATENT DOCUMENTS

| | | |
|---|---|---|
| CN | 112331145 | 2/2021 |
| CN | 117119088 | 11/2023 |
| EP | 2993871 | 3/2016 |
| EP | 3399728 | 11/2018 |
| KR | 20060124209 | 12/2006 |
| KR | 20120120098 | 11/2012 |
| WO | 2020156309 | 8/2020 |
| WO | 2020215878 | 10/2020 |
| WO | 2022046025 | 3/2022 |
| WO | 2022132370 | 6/2022 |

OTHER PUBLICATIONS

"International Search Report and Written Opinion", Application No. PCT/US2021/059750, Feb. 25, 2022, 11 pages.
"International Search Report and Written Opinion", Application No. PCT/US2020/047670, May 12, 2021, 13 pages.
"Non-Final Office Action", U.S. Appl. No. 17/507,293, filed Feb. 17, 2023, 7 pages.
"Notice of Allowance", U.S. Appl. No. 17/139,465, filed May 18, 2022, 9 pages.
"Notice of Allowance", U.S. Appl. No. 17/507,293, filed Jun. 28, 2023, 7 pages.
"Samsung Galaxy Z Flip: Top Features", Accessed online at: https://www.themobileindian.com/picture-story/samsung-galaxy-z-flip-top-features-1309-14229 on Oct. 20, 2020, Feb. 15, 2020, 6 pages.
Choi, Sangmoo, "Clock Trace Structure for Block Sequential Clock Driving", Technical Disclosure Commons, https://www.tdcommons.org/dpubs_series/4786, Dec. 19, 2021, 11 pages.
Choi, Sangmoo, "Deposition of Black Material on Metal Traces Surrounding Display Screen Blind-Holes to Increase Camera Performance and Improve Ae", Technical Disclosure Commons— https://www.tdcommons.org/dpubs_series/4321, May 25, 2021, 10 pages.
Choi, et al., "Dynamically Altering Clock Signal Frequencies in LTPO AMOLED Displays", Technical Disclosure Commons, https://www.tdcommons.org/dpubs_series/4652, Oct. 12, 2021, 11 pages.
Choi, et al., "Expediting Fingerprint Authentication by Compensating for Display Luminance Latency", Technical Disclosure Commons, https://www.tdcommons.org/dpubs_series/4686, Oct. 29, 2021, 11 pages.

(56) References Cited

OTHER PUBLICATIONS

Choi, et al., "Light-Guiding Structure For Under-Display Sensor Modules", Technical Disclosure Commons; https://www.tdcommons.org/dpubs_series/3527, Aug. 17, 2020, 8 pages.

Choi, et al., "Readability Enhancements for Device Displays used in BrightReadability Enhancements for Device Displays used in BrightLighting Conditions", Technical Disclosure Commons—https://www.tdcommons.org/dpubs_series/3871, Dec. 10, 2020, 9 pages.

Hou, et al., "Foldable Display Stack-Up Structures with a Divided Thin Glass Layer", Technical Disclosure Commons—https://www.tdcommons.org/dpubs_series/6406, Nov. 8, 2023, 10 pages.

Iorga, Radu, "Huawei Mate X2 5G Gets Rendered And Looks a Lot Like the Galaxy Z Fold 2 5G", Accessed online at: https://tablet-news.com/huawei-mate-x2-5g-gets-rendered-and-looks-a-lot-like-the-galaxy-z-fold-2-5g/ on Oct. 20, 2020, Oct. 13, 2020, 3 pages.

Li-Fong, et al., "A Circular Flexible Amoled Display with a 1-mm Slim Border", May 25, 2016, pp. 847-850.

Lih, et al., "A True Circular 1.39 Inch Amoled for Wearable Application", May 2016, pp. 566-569.

Lin, et al., "Preventing Dust Ingression into a Foldable Mobile Device", Technical Disclosure Commons, https://www.tdcommons.org/dpubs_series/7587, Nov. 22, 2024, 8 pages.

Lombardi, et al., "Adaptive User Interface for a Camera Aperture within an Active Display Area", Technical Disclosure Commons; Retrieved from https://www.tdcommons.org/dpubs_series/2719, Nov. 25, 2019, 12 pages.

Skanda, Sai, "Xiaomi Mi 9 to Feature an Improved In-screen Fingerprint Sensor", https://www.gizchina.com/2019/02/17/mi-9-fingerprint-improved-fingerprint/, Feb. 17, 2019, 10 pages.

Subramaniam, Vaidyanathan, "LG Patents a True Bezel-Less Smartphone Display with an In-Display Selfie Camera", Accessed online at: https://www.notebookcheck.net/LG-patents-a-true-bezel-less-smartphone-display-with-an-in-display-selfie-camera.357626.0.html on Oct. 20, 2020, Nov. 7, 2018, 4 pages.

Wakser, et al., "Form-in-Place Adhesive Gasket to Waterproof an Electronic Device", Technical Disclosure Commons; Retrieved from https://www.tdcommons.org/dpubs_series/3239, May 18, 2020, 7 pages.

Wen, et al., "Improving Under-Display Fingerprint Authentication Latency by Normalizing Frame Luminance", Technical Disclosure Commons—https://www.tdcommons.org/dpubs_series/5006, Mar. 24, 2022, 12 pages.

Yonebayashi, et al., "High refresh rate and low power consumption AMOLED panel using top-gate n-oxide and p-LTPS TFTs", Mar. 2020, 10 pages.

* cited by examiner

700

702

| Housing |
| :---: |
| 704 |

| Processor(s) |
| :---: |
| 706 |

| Computer-Readable Media |
| :---: |
| 708 |
| Operating System |
| 710 |

| I/O Ports |
| :---: |
| 712 |

| Sensor(s) |
| :---: |
| 714 |

| Display(s) |
| :---: |
| 716 |
| Cover Layer(s) |
| 718 |
| Display Panel(s) |
| 720 |

| Battery |
| :---: |
| 722 |

INTERNAL HARDWARE CONFIGURATIONS WITHIN FOLDABLE ELECTRONIC DEVICES

CROSS-REFERENCE TO RELATED APPLICATION(S)

This application claims the benefit of U.S. Provisional Patent Application Ser. No. 63/648,528 filed on May 16, 2024, the disclosure of which is incorporated by reference herein in its entirety.

SUMMARY

This document describes systems and techniques directed at internal hardware configurations for foldable devices. In aspects, a foldable electronic device includes a housing, defining an internal cavity within which a battery is disposed, and one or more displays that are fixed to the housing, forming at least one internal cavity. The foldable electronic device further includes one or more battery cell tabs that are arranged in an unfolded configuration and extend from the battery to a power control module positioned underneath a display control module that is mounted to the display. Through such a configuration, an internal volume within the internal cavity can be more-efficiently occupied by increasing a battery capacity or reducing a dimensional profile of the foldable electronic device.

In aspects, a foldable electronic device is disclosed that includes a housing having a folding region that separates a first non-folding region and second non-folding region. At least one of the first non-folding region or the second non-folding region is configured to rotate about the folding region. The foldable electron device further includes one or more displays positioned within at least one of the first non-folding region or the second non-folding region of the housing sufficient to define an internal cavity. The foldable electronic device further includes a display control module configured to control operations of a respective display of the one or more displays. In implementations, the display control module is positioned within the internal cavity and mounted to a surface of the respective display. The foldable electronic device also includes a battery disposed within the internal cavity. The foldable electronic device further includes one or more battery cell tabs arranged in an unfolded configuration and extending from the battery to a power control module. The power control module positioned beneath the display control module at a lower layer along an axis perpendicular to the surface of the respective display such that the display control module is disposed between the power control module and the respective display.

This Summary is provided to introduce simplified concepts of systems and techniques directed at internal hardware configurations within foldable electronic devices for optimized volumetric efficiency and/or battery capacity, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of systems and techniques directed at internal hardware configurations within foldable electronic devices for optimized volumetric efficiency and/or battery capacity are described in this document with reference to the following drawings.

The same numbers are used throughout the Drawings to reference like features and components.

DETAILED DESCRIPTION

Overview

Many electronic devices include displays, such as light-emitting diode (LED) displays or liquid crystal displays (LCDs). Electronic device manufacturers often fabricate displays in a layered structure (a "display panel stack"). The display panel stack includes a display module having a display panel that, when integrated into an electronic device, is disposed underneath and shielded by a cover layer (e.g., a glass layer). The display panel stack may further include one or more of a touch layer (e.g., touch sensor panel), a polarizer layer (e.g., polarization filters), an adhesive layer, and/or a protective layer (e.g., an EMBO layer).

The protective layer may include one or more sublayers, such as a polymer sublayer (e.g., polyethylene terephthalate (PET) substrate), a metallic sublayer (e.g., copper, stainless steel), a foam pad (e.g., to absorb compressive forces during manufacturing or usage), and an adhesive sublayer. The protective layer shields delicate display panels from both mechanical and electromagnetic forces, as well as from thermal radiation.

Physical or electrical damage to a display panel can quickly render portions of the display panel inoperable, spoiling a user's experience. Thus, display panels are handled with great care during manufacturing and are often surrounded by many shielding components, including the protective layer and the cover layer, for protection during manufacturing and/or device usage. Not only are display panels delicate, but they are also elaborate, requiring sophisticated manufacturing techniques to intricately design an array of pixel circuits within the display of the display module. Pixel arrays include tens of thousands of pixels organized into a two-dimensional grid (e.g., a circular grid, a rectangular grid). Each of the pixel circuits may include an organic light-emitting diode ("pixel") composed of, for example, a red sub-pixel, a green sub-pixel, and/or a blue sub-pixel. To power and control the pixel array, display modules often include routing circuitry, surrounding a perimeter of the pixel array, connecting the pixels to one or more drivers. In one example, a pixel array having a two-dimensional rectangular grid of pixels is operably coupled to one or more row-line drivers via electrical traces (e.g., wires). Electronic devices can, via the one or more drivers, control the pixels within a display panel to illuminate at various intensities and wavelengths (e.g., combined wavelengths of the sub-pixels), effective to produce on-screen content (e.g., images). Such display panels are well-suited for electronic devices and are further appreciated by users, in large part, because of their image quality.

Figure 1:
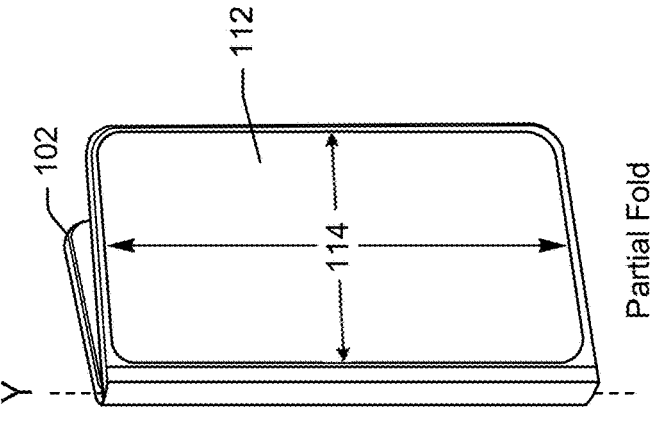
FIG. 1 illustrates an example foldable electronic device that can implement internal hardware configurations within foldable electronic devices for optimized volumetric efficiency.

To provide users with large display experiences in small product form factors, manufacturers may design electronic devices, including at least portions of display panel stacks, to fold into one or more configurations ("foldable electronic devices"). As illustrated in FIG. 1, a foldable electronic device 102 with a foldable display 104 having an active area 106, can include one or more folding regions (e.g., folding region 108) about which one or more non-folding regions 110 (e.g., first non-folding region 110-1, second non-folding region 110-2) may rotate (e.g., a Y-axis). The non-folding regions may fold towards or away from each other to achieve one of a variety of foldable display shapes, such as a 'Z' shape or 'C' shape. One foldable display shape may be chosen over another foldable display shape based on design factors, such as having the foldable display on an inside or an outside of the foldable electronic device when in a folded position. Commonly, a foldable display includes one primary folding region that divides the display into two equal segments (e.g., non-folding regions), which are generally equidistant from the primary folding region. In some instances, the foldable electronic device 102 may further include a non-folding display 112 having an active area 114 that may operate as a primary display (in lieu of the foldable display 104) when the foldable electronic device 102 is in a folded state (or a partial folded state).

Such foldable electronic devices are prized by users for their maximized display size and small form factor. To achieve these features, foldable electronic devices are generally designed having small thicknesses, such as along a Z-axis, as illustrated in FIG. 1. However, an equally important attribute also valued by users is battery life (e.g., how long a fully-charged battery can power a device without additional charge), which is correlated with battery size. Frequently, the thinner an electronic device, the smaller the battery capacity. Conversely, the larger the battery, the thicker an electronic device, which is particularly true for foldable electronic devices.

To this end, this document describes systems and techniques directed at internal hardware configurations for foldable devices. In aspects, a foldable electronic device includes a housing, defining an internal cavity within which a battery is disposed, and one or more displays that are fixed to the housing, forming at least one internal cavity. The foldable electronic device further includes one or more battery cell tabs that are arranged in an unfolded configuration and extend from the battery to a power control module positioned underneath a display control module that is mounted to the display. Through such a configuration, an internal volume within the internal cavity can be more-efficiently occupied by increasing a battery capacity or reducing a dimensional profile of the foldable electronic device.

The following discussion describes operating environments and techniques that may be employed in the operating environments and example methods. Although systems and techniques directed at internal hardware configurations within foldable electronic devices for optimized volumetric efficiency and/or battery capacity are described, it is to be understood that the subject of the appended Claims is not necessarily limited to the specific features or methods described. Rather, the specific features and methods are disclosed as example implementations and reference is made to the operating environment by way of example only.

Example Implementations

The following discussion describes example implementations, techniques, apparatuses that may be employed in the example implementations. In the context of the present document, reference is made to the following by way of example only.

Figure 2:
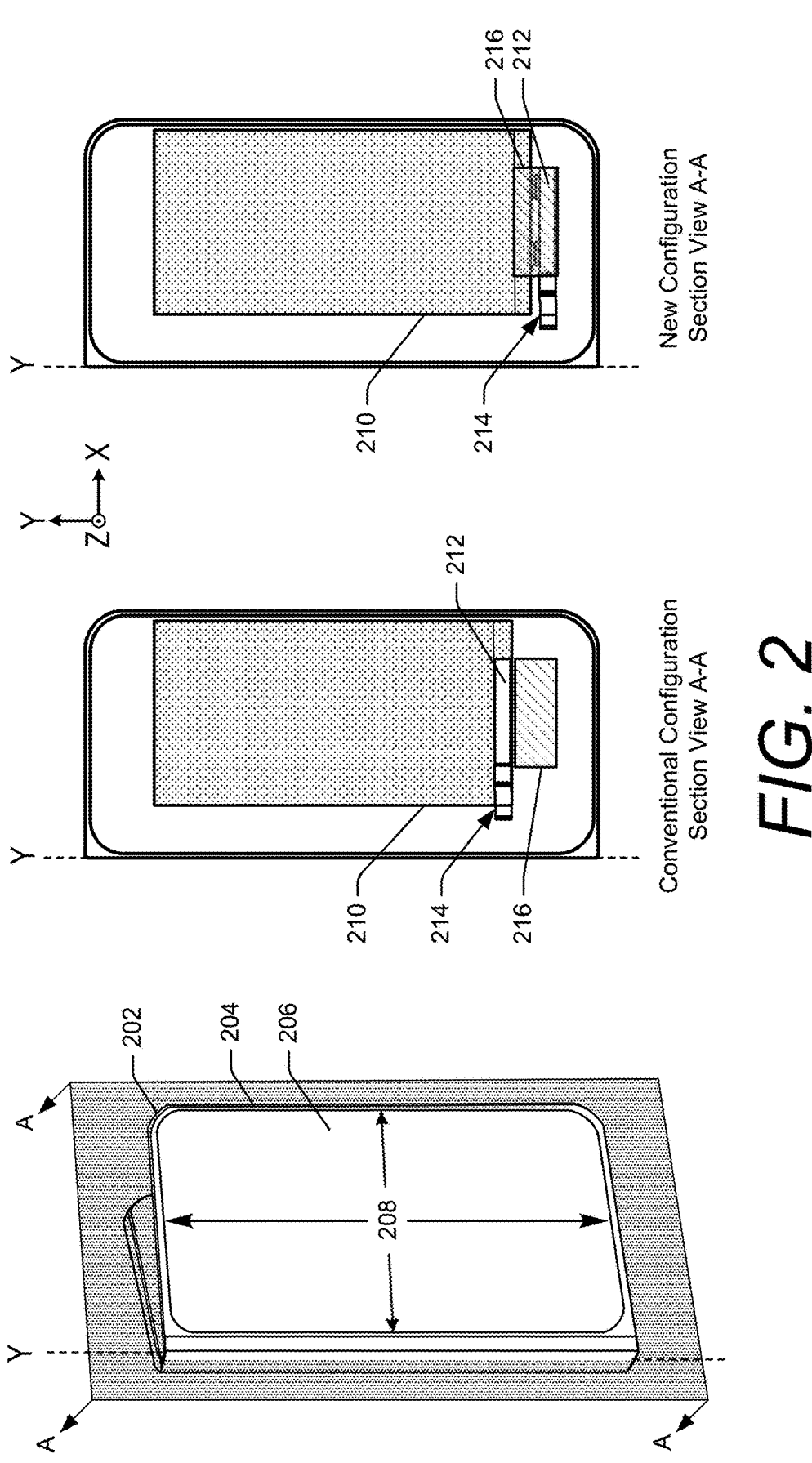
FIG. 2 illustrates an example implementation of an example foldable electronic device having internal hardware configurations optimized for volumetric efficiency and battery capacity in accordance with one or more implementations.

Consider FIG. 2, which illustrates an example implementation 200 of an example foldable electronic device 202 having internal hardware configurations optimized for volumetric efficiency and battery capacity in accordance with one or more implementations. As illustrated, the example foldable electronic device 202 includes a housing 204 (e.g., a frame) and at least one display 206 (e.g., a foldable display). The foldable electronic device 202 may be configured to fold along one or more axes (e.g., a Y-axis). The foldable electronic device 202 includes an active area 208 defined by at least one of the housing 204, a trim (not illustrated), or an opaque border (not illustrated) added to a bottom face of a cover layer (e.g., cover glass).

In implementations, the housing 204 and the at least one display 206 define an internal cavity within which a battery 210 disposed. In implementations, the battery 210 is a rechargeable battery that is configured to store and supply electrical energy. The rechargeable battery 318 may be any suitable rechargeable battery, such as a lithium-ion (Li-ion) battery. Various different Li-ion-battery chemistries may be implemented, some examples of which include lithium cobalt oxide (LiCoO2), lithium iron phosphate (LiFePO4), lithium manganese oxide (LiMn2O4 spinel, or Li2MnO3-based lithium-rich layered materials, LMR-NMC), and lithium nickel manganese cobalt oxide (LiNiMnCoO2, Li-NMC, LNMC, NMC, or NCM and the various ranges of Co stoichiometry). Also, Li-ion batteries may include various different anode materials, including graphite-based anodes, silicon (Si), graphene, and other cation intercalation/insertion/alloying anode materials. The battery 210 further includes battery terminals (not illustrated) for connection to a load and a power source.

A power control module 212 may be operatively coupled to the battery 210 via one or more battery cell tabs (not illustrated). The power control module 212 includes a battery control circuit that controls the charging and discharging of the battery 210. The power control module 212 may be electrically coupled to one or more routing lines 214 to facilitate a distribution or receipt of electrical energy.

The foldable electronic device 202 further includes a display control module 216. In implementations, the display control module 216 includes display control circuitry (not illustrated) configured to control operations of the at least one display 206. The display control circuitry may be further configured to control operations of a touch sensor integral and/or operational with the at least one display 206. The display control circuitry includes a printed circuit (e.g., a flexible printed circuit (FPC)) and one or more control components mounted thereon. In at least some implementations, the display control module 216 is positioned within the internal cavity and mounted (e.g., adhered, strapped) to a backside of the at least one display 206 (e.g., via the FPC).

As illustrated in a conventional configuration section view A-A, the power control module 212 and the battery 210 are positioned adjacent to the display control module 216, with no overlap along a Z-axis (e.g., an axis perpendicular to a plane defined by a face of the at least one display 206, an axis perpendicular to a plane defined by a face of the battery 210). For example, the power control module 212 is disposed on a terrace (e.g., a lip, an extended surface) of the battery 210 and is positioned next to the display control module 216.

Figure 3:
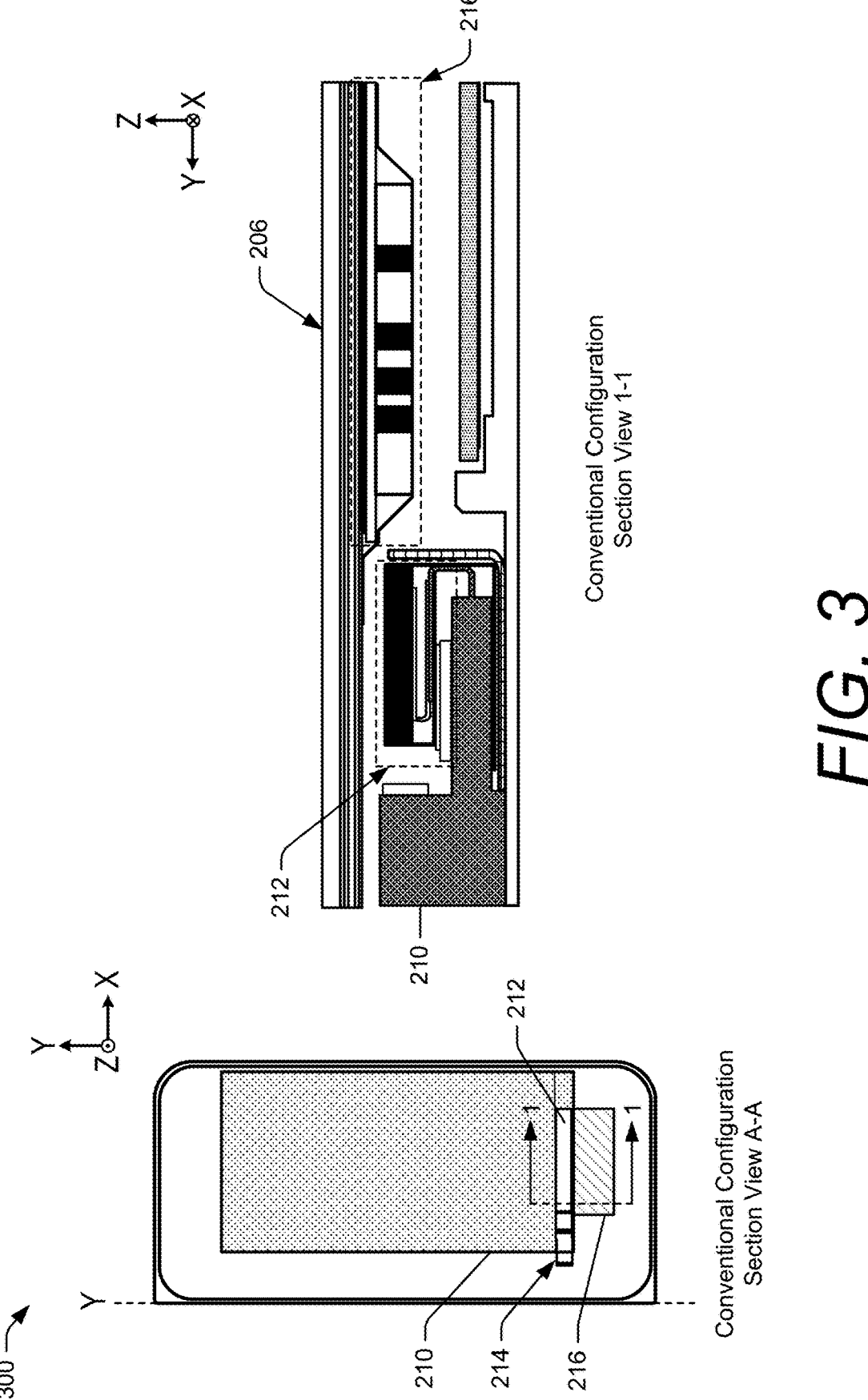
FIG. 3 illustrates an example section view 1-1 of a conventional configuration.

Consider FIG. 3, which illustrates an example section view 1-1 of the conventional configuration. As illustrated, the power control module 212 is disposed on a surface of the battery 210 and is positioned adjacent to the display control module 216, such that there is no overlap along the Z-axis. In such a configuration, a length of the battery 210, and therefore a battery capacity, is limited based on a location and a size of the display control module 216 and/or a location and a size of the power control module 212. Generally, manufacturers of electronic devices, including foldable electronic devices, prioritize an internal volumetric efficiency, particularly along the Z-axis, to reduce device thickness. This prioritization of internal volumetric efficiency along the Z-axis often leads to minimizing a layering (or an overlap) of components within foldable electronic devices.

Referring back to FIG. 2, as illustrated in a new configuration section view A-A (and in contrast to the conventional configuration), at least one of the power control module 212 and the battery 210 are positioned at least partially underneath the display control module 216, along the Z-axis (e.g., an axis perpendicular to a plane defined by a face of the at least one display 206, an axis perpendicular to a plane defined by a face of the battery 210). In implementations, the battery 210 is enlarged (e.g., along the Y-axis) so as to reside beneath the display control module 216.

Figure 4:
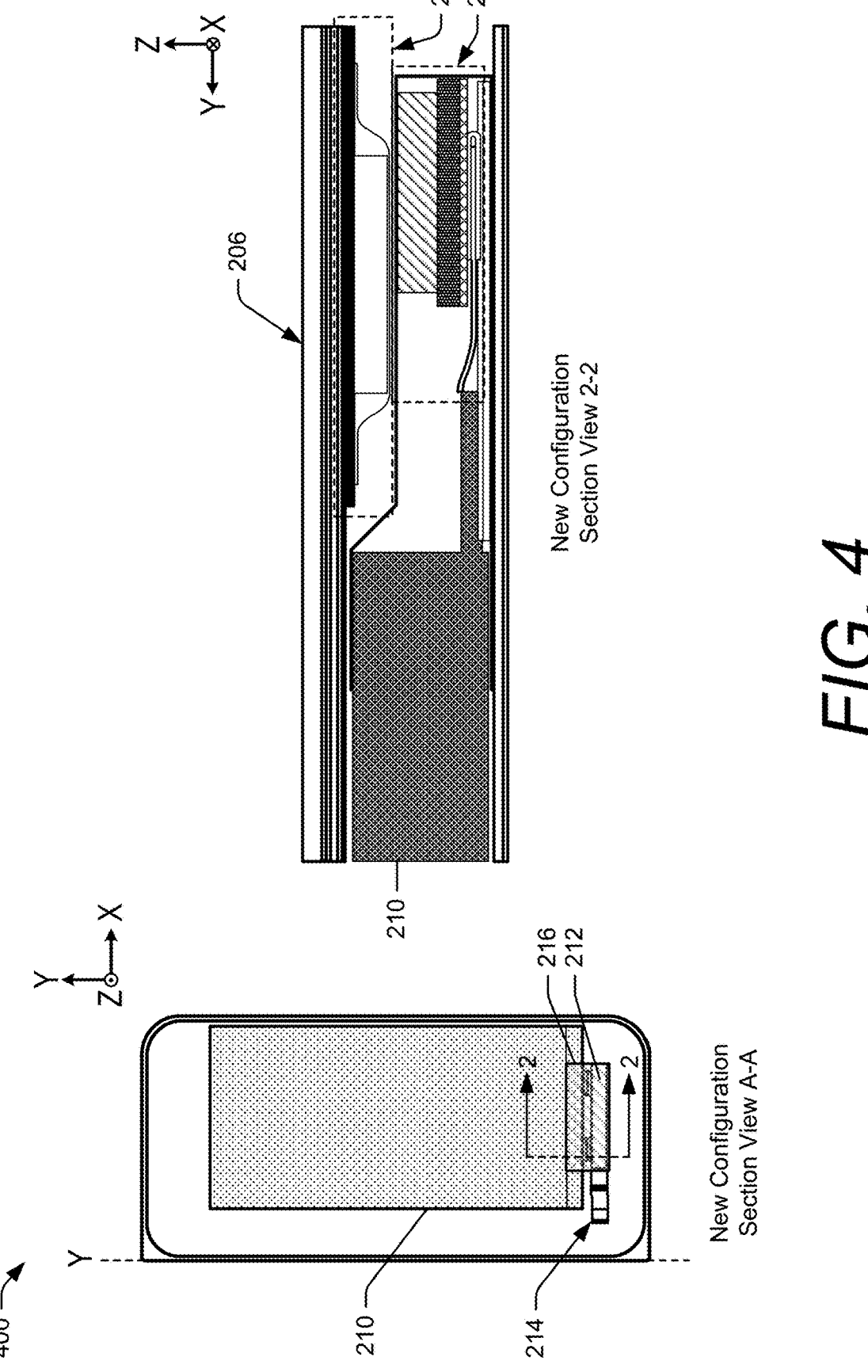
FIG. 4 illustrates an example section view 2-2 of a new configuration in accordance with one or more implementations.

Consider FIG. 4, which illustrates an example section view 2-2 of the new configuration in accordance with one or more implementations. As illustrated, the display control module 216 is mounted to a backside of the display 206 and is positioned above at least portions of the battery 210 and the power control module 212. In the new configuration, the display control module 216 may remain in a location similar to a location as in the conventional configuration, but the power control module 212 may be extended underneath the display control module 216 adjacent to the battery 210, rather than positioned on a surface of the battery 210. Further, a length of the battery 210 (e.g., along the Y-axis) may be extended such that the battery 210 is at least partially disposed underneath the display control module 216. Such a configuration may be counterintuitive to manufacturers of electronic devices because a volumetric efficiency along the Y-axis is prioritized above a volumetric efficiency along the Z-axis, and yet an overall internal volumetric efficiency of the foldable electronic device 202 may be maximized.

Further, in such a configuration, a length of the battery 210 can be extended to increase a battery capacity, for example, 150 milliampere-hours (mAh). Alternatively, a thickness of the battery 210 (e.g., along the Z-axis) can be reduced and the length of the battery 210 can be extended, resulting in a greater-than-or-equal-to battery capacity, and a thinner device profile (e.g., along the Z-axis).

Figure 5:
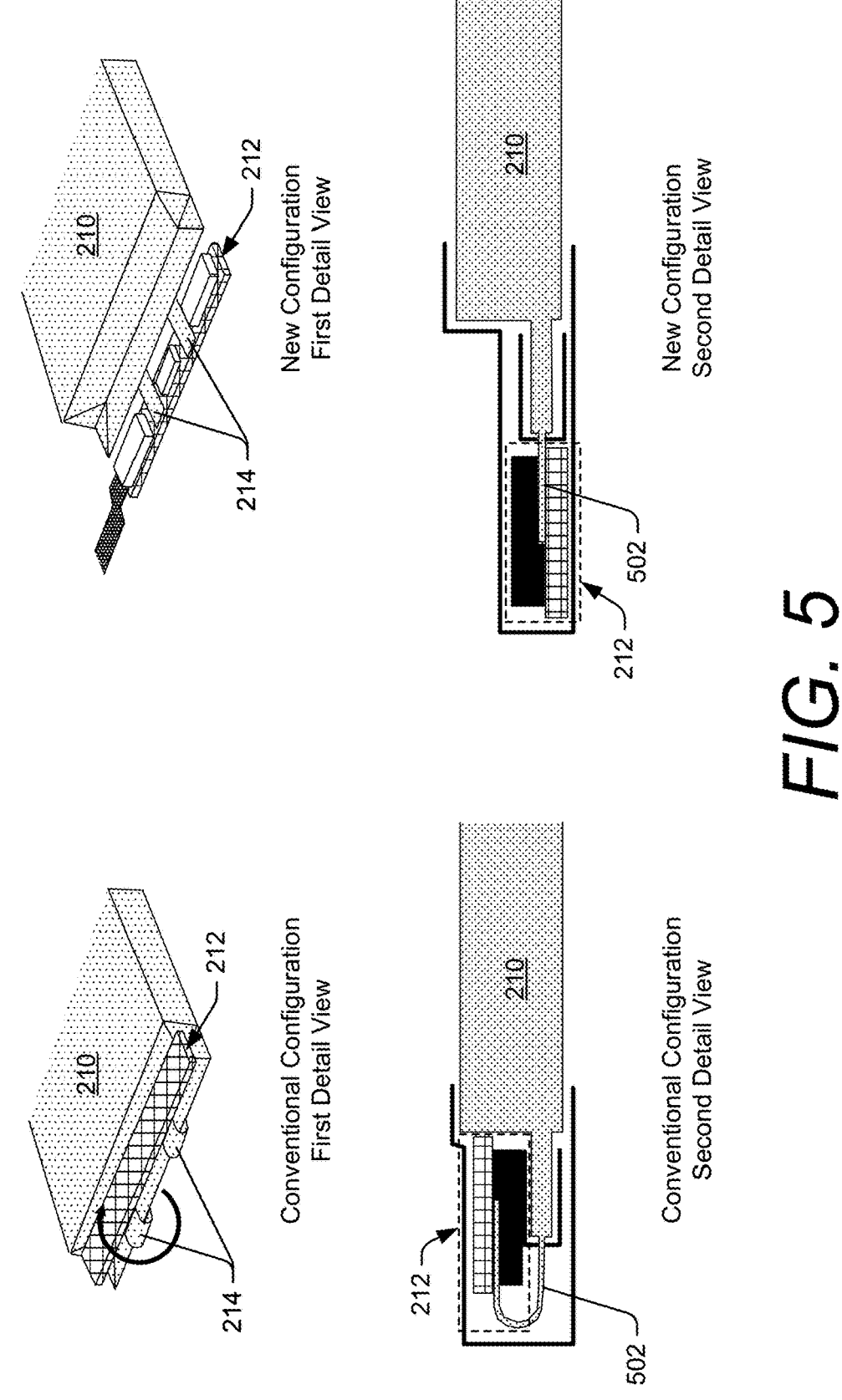
FIG. 5 illustrates a first example detail view and a second example detail view of the conventional configuration and a first example detail view and a second example detail view of the new configuration in accordance with one or more implementations.

FIG. 5 illustrates a first example detail view and a second example detail view of the conventional configuration and a first example detail view and a second example detail view of the new configuration in accordance with one or more implementations. As illustrated, the detail views include the battery 210, the power control module 212, and one or more battery cell tabs 502 that operatively couple the battery 210 to the power control module 212. Generally, as illustrated in the conventional configuration detail views, the one or more battery cell tabs 502 are rolled into a folded configuration such that the power control module 212 is disposed on a surface (e.g., a terrace) of the battery 210. This conventional configuration creates a compact and approximately-rectangular power storage and distributing product that occupies a clear and defined amount of space.

In contrast, as illustrated in the new configuration detail views, the one or more battery cells tabs 502 are counterintuitively arranged in an unfolded configuration, extending from the battery 210 to the power control module 212. In this way, the power control module 212 can be disposed underneath the display control module 216 (not illustrated), increasing a volumetric efficiency in the Y-axis and enabling the battery 210 to be enlarged in the Y-axis. In addition, the one or more battery cell tabs 502 being in an unfolded configuration allow for a reduction in a number of assembly operations during manufacturing of the foldable electronic device 202.

Figure 6:
FIG. 6 illustrates an increase in length of the battery between the conventional configuration section view 1-1 and the new configuration section view 2-2.

FIG. 6 illustrates an increase in length of the battery 210 between the conventional configuration section view 1-1 and the new configuration section view 2-2. As illustrated, due the unfolded configuration of the one or more battery cell tabs 502 (not labeled) and the placement of the power control module 212 underneath the display control module 216, the length of the battery 210 can be increased approximately 5 millimeters, which may be equivalent to approximately 150 mAh.

Operating Environment

Figure 7:
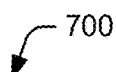
FIG. 7 illustrates an example foldable electronic device having internal hardware configurations for optimized volumetric efficiency and/or battery capacity in accordance with one or more implementations.

FIG. 7 illustrates an example foldable electronic device 702 having internal hardware configurations for optimized volumetric efficiency and/or battery capacity in accordance with one or more implementations. The foldable electronic device 702 may include additional components and interfaces omitted from FIG. 7 for the sake of clarity.

The foldable electronic device 702 can be any of a variety of consumer electronic devices. As non-limiting examples, the foldable electronic device 702 can be a foldable smartphone, a foldable tablet device, a foldable laptop computer, a foldable portable video game console, and the like, or any electronic device that positions a power control module (e.g., power control module 212) in proximity to a display control module (e.g., display control module 216).

The foldable electronic device 702 includes a housing 704, which defines at least one internal cavity within which one or more of a plurality of electronic components may be disposed. In implementations, a mechanical frame may define one or more portions of the housing 704. As an example, a mechanical frame can include plastic or metallic walls that define portions of the housing 704. In additional implementations, a mechanical frame may support one or more portions of the housing 704. As an example, one or more exterior housing components (e.g., plastic panels) can be attached to the mechanical frame (e.g., a chassis). In so doing, the mechanical frame physically supports the one or more exterior housing components, which define portions of the housing 704. In implementations, the mechanical frame and/or the exterior housing components may be composed of crystalline or non-crystalline solids. In implementations, the housing 704 may be sealed through the inclusion of one or more displays (e.g., at least one display 206), defining at least one internal cavity.

The foldable electronic device 702 may further include one or more processors 706. The processor(s) 706 can include, as non-limiting examples, a system on a chip (SoC), an application processor (AP), a central processing unit (CPU), or a graphics processing unit (GPU). The processor(s) 706 generally execute commands and processes utilized by the foldable electronic device 702 and an operating system installed thereon. For example, the processor(s) 706 may perform operations to display graphics of the foldable electronic device 702 on the one or more displays and can perform other specific computational tasks.

The foldable electronic device 702 may also include computer-readable storage media (CRM) 708. The CRM 708 may be a suitable storage device configured to store device data of the foldable electronic device 702, user data, and multimedia data. The CRM 708 may store an operating system 710 that generally manages hardware and software resources (e.g., the applications) of the foldable electronic device 702 and provides common services for applications stored on the CRM 708. The operating system 710 and the applications are generally executable by the processor(s) 706 to enable communications and user interaction with the foldable electronic device 702. One or more processor(s) 706, such as a GPU, perform operations to display graphics of the foldable electronic device 702 on the one or more displays and can perform other specific computational tasks. The processor(s) 706 can be single-core or multiple-core processors.

The foldable electronic device 702 may also include input/output (I/O) ports 712. The I/O ports 712 allow the foldable electronic device 702 to interact with other devices or users. The I/O ports 712 may include any combination of internal or external ports, such as universal serial bus (USB) ports, audio ports, Serial ATA (SATA) ports, PCI-express based ports or card-slots, secure digital input/output (SDIO) slots, and/or other legacy ports.

The foldable electronic device 702 may further include one or more sensors 714. The sensor(s) 714 can include any of a variety of sensors, such as an audio sensor (e.g., a microphone), a touch-input sensor (e.g., a touchscreen), an image-capture device (e.g., a camera, video-camera), proximity sensors (e.g., capacitive sensors), an under-display fingerprint sensor, or an ambient light sensor (e.g., photodetector). In implementations, the foldable electronic device 202 includes one or more of a front-facing sensor(s) and a rear-facing sensor(s).

Further, the foldable electronic device 702 includes the one or more displays 716 (e.g., a foldable display) having one or more cover layers 718 and one or more display panels 720. The cover layer(s) 718 may be implemented as any of a variety of transparent materials including polymers (e.g., plastic, acrylic) or glasses. The cover layer(s) 718 may form any foldable, three-dimensional shape.

The display panel(s) 720 may include a two-dimensional pixel array (not illustrated in FIG. 7) forming a grid, operably coupled to one or more row-line drivers via electrical traces. The pixel array emits light to create an image on the display panel(s) 720 upon electrical activation by one or more drivers. As an example, data-line drivers provide voltage data via electrical traces to the pixel array to control a luminance of individual pixels.

The foldable electronic device 702 further includes a battery 722 (e.g., battery 210). In implementations, the battery 210 is a rechargeable battery that is configured to store and supply electrical energy. The rechargeable battery 318 may be any suitable rechargeable battery, such as a lithium-ion (Li-ion) battery.

CONCLUSION

Unless context dictates otherwise, use herein of the word "or" may be considered use of an "inclusive or," or a term that permits inclusion or application of one or more items that are linked by the word "or". Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying Drawings and terms discussed herein may be indicative of one or more items or terms, and thus reference may be made interchangeably to single or plural forms of the items and terms in this written description.

Terms such as "above," "below," or "underneath" are not intended to require any particular orientation of a device. Rather, a first layer or component, being provided "above" a second layer or component is intended to describe the first layer being at a higher Z-dimension than the second layer of component within the particular coordinate system in use. It will be understood that should the component be provided in another orientation, or described in a different coordinate system, then such relative terms may be changed.

Although implementations directed at internal hardware configurations for foldable devices have been described in language specific to certain features and/or methods, the subject of the appended Claims is not necessarily limited to the specific features or methods described. Rather, the specific features and methods are disclosed as example implementations directed at internal hardware configurations for foldable devices.

What is claimed is:

1. A foldable electronic device comprising:
   a housing having a folding region that separates a first non-folding region and a second non-folding region, at least one of the first non-folding region or the second non-folding region configured to rotate about the folding region;
   one or more displays positioned within at least one of the first non-folding region or the second non-folding region of the housing sufficient to define an internal cavity;
   a display control module configured to control operations of a respective display of the one or more displays, the display control module positioned within the internal cavity and mounted to a surface of the respective display;
   a battery disposed within the internal cavity; and
   one or more battery cell tabs arranged in an unfolded configuration and extending from the battery to a power control module, the power control module positioned beneath the display control module at a lower layer along an axis perpendicular to the surface of the respective display such that the display control module is disposed between the power control module and the respective display.

2. The foldable electronic device of claim 1, wherein the battery is disposed at least partially beneath the display control module at a lower layer than the display control module along the axis perpendicular to the surface of the respective display such that the display control module is disposed between portions of the battery and the respective display.

3. The foldable electronic device of claim 2, wherein the lower layer of the power control module and the lower layer of the battery are coplanar.

4. The foldable electronic device of claim 1, wherein the power control module is disposed adjacent to the battery along an axis parallel to the surface of the respective display.

5. The foldable electronic device of claim 1, wherein the one or more displays comprise two displays, the two displays including a foldable display and a non-foldable display.

6. The foldable electronic device of claim 5, wherein the respective display comprises the non-folding display.

7. The foldable electronic device of claim 1, wherein the battery, the display control module, the power control module, and the one or more battery cell tabs are disposed within the first non-folding region or the second non-folding region.

\* \* \* \* \*